(12) United States Patent
Choi et al.

(10) Patent No.: US 12,364,062 B2
(45) Date of Patent: Jul. 15, 2025

(54) DISPLAY DEVICE USING MICRO LED

(71) Applicant: LG ELECTRONICS INC., Seoul (KR)

(72) Inventors: Hwanjoon Choi, Seoul (KR); Yonghan Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 683 days.

(21) Appl. No.: 17/616,550

(22) PCT Filed: Feb. 6, 2020

(86) PCT No.: PCT/KR2020/001691
§ 371 (c)(1),
(2) Date: Dec. 3, 2021

(87) PCT Pub. No.: WO2020/256250
PCT Pub. Date: Dec. 24, 2020

(65) Prior Publication Data
US 2022/0238759 A1   Jul. 28, 2022

(30) Foreign Application Priority Data
Jun. 20, 2019  (KR) .................. 10-2019-0073649

(51) Int. Cl.
*H01L 25/075* (2006.01)
*H10H 20/813* (2025.01)
(Continued)

(52) U.S. Cl.
CPC ....... *H10H 20/813* (2025.01); *H01L 25/0753* (2013.01); *H10H 20/8312* (2025.01); *H10H 20/857* (2025.01); *H10H 29/142* (2025.01)

(58) Field of Classification Search
CPC ... H01L 27/156; H01L 33/08; H01L 25/0652; H01L 25/071; H01L 25/112;
(Continued)

(56) References Cited

U.S. PATENT DOCUMENTS

2015/0255439 A1\* 9/2015 Kim ............... H01L 25/0753
257/89
2017/0103966 A1\* 4/2017 Choi ................. H01L 24/81
(Continued)

FOREIGN PATENT DOCUMENTS

EP      3731275 A1 \* 10/2020  ........... H01L 24/05
JP      2019-83301 A    5/2019
(Continued)

*Primary Examiner* — Wael M Fahmy
*Assistant Examiner* — Quinton A Brasfield
(74) *Attorney, Agent, or Firm* — Birch, Stewart, Kolasch & Birch, LLP

(57) ABSTRACT

Discussed is a display device including a substrate including a plurality of electrode lines; and a plurality of semiconductor light emitting devices disposed on the substrate and electrically connected to the plurality of electrode lines; wherein each of the plurality of semiconductor light emitting devices includes: a first conductive semiconductor layer; a plurality of second conductive semiconductor layers formed on the first conductive semiconductor layer; and an active layer formed between the first and second conductive semiconductor layers, and wherein each of the plurality of semiconductor light emitting devices includes a plurality of active layers spaced apart from each other.

20 Claims, 11 Drawing Sheets

(51) Int. Cl.
*H10H 20/831* (2025.01)
*H10H 20/857* (2025.01)
*H10H 29/14* (2025.01)

(58) Field of Classification Search
CPC . H01L 25/042; H01L 25/0655; H01L 25/072; H01L 25/0753; H01L 25/115; H10H 20/813; H10H 20/8132; H10H 29/10–142; H10H 29/30–962
See application file for complete search history.

(56) References Cited

U.S. PATENT DOCUMENTS

| | | | |
|---|---|---|---|
| 2017/0338211 A1 | 11/2017 | Lin et al. | |
| 2020/0127173 A1* | 4/2020 | Park | H01L 25/0753 |
| 2021/0280741 A1* | 9/2021 | Lo | H10D 86/423 |

FOREIGN PATENT DOCUMENTS

| | | | | |
|---|---|---|---|---|
| KR | 10-2015-0104446 A | 9/2015 | | |
| KR | 10-2018-0007376 A | 1/2018 | | |
| KR | 10-2018-0090529 A | 8/2018 | | |
| KR | 10-2019-0054461 A | 5/2019 | | |
| WO | WO-2017160119 A1 * | 9/2017 | ........... | H01L 25/075 |

* cited by examiner (a)

(b)

(c)

(d)

(e)

(f)

DISPLAY DEVICE USING MICRO LED

CROSS REFERENCE TO RELATED APPLICATIONS

This application is the National Stage filing under 35 U.S.C. 371 of International Application No. PCT/KR2020/001691, filed on Feb. 6, 2020, which claims the benefit of earlier filing date of and right of priority to Korean Application No. 10-2019-0073649 filed on Jun. 20, 2019, the contents of all these applications are all hereby incorporated by reference in their entirety into the present application.

TECHNICAL FIELD

The present disclosure relates to a display device using a micro-LED (or micro LED), and more particularly, to a display device using a semiconductor light emitting device with a size of several µm to several tens of µm.

BACKGROUND ART

In recent years, display devices having excellent characteristics, such as a thin shape, flexibility, and the like, are being developed in a field of a display technology. Currently commercialized main displays are represented by liquid crystal displays (LCDs) and active matrix organic light emitting diodes (AMOLEDs).

Light emitting diodes (LEDs), which are well known light emitting devices for converting an electrical current to light, have been used as a light source for displaying an image in an electronic device including information communication devices since red LEDs using GaAsP compound semiconductors were made commercially available in 1962, together with a GaP:N-based green LEDs. Accordingly, the semiconductor light emitting devices may be used to implement a display, thereby presenting a scheme for solving the problems.

When manufacturing a display device using semiconductor light emitting devices, a step of high temperature exposure may be included. In the related art display device using semiconductor light emitting devices, a conductive adhesive is mainly used. When the conductive adhesive is exposed to a high temperature, an adhesive force may be lost, causing the semiconductor light emitting devices to be separated from a substrate. This leads to a reduction in productivity of the display device. Thus, attempts have been made to manufacture a display device without using a conductive adhesive.

DISCLOSURE OF INVENTION

Technical Problem

The present disclosure describes semiconductor light emitting devices capable of maintaining light emitting ability even when a part of the semiconductor light emitting devices is damaged.

Solution to Problem

According to one aspect of the subject matter described in this application, a display device includes a substrate including a plurality of electrode lines, and a plurality of semiconductor light emitting devices disposed on the substrate and electrically connected to the electrode lines. Each of the plurality of semiconductor light emitting devices includes a first conductive semiconductor layer, a second conductive semiconductor layer formed on the first conductive semiconductor layer, and an active layer formed between the first and second conductive semiconductor layers. The second conductive semiconductor layer is provided in plurality on the first conductive semiconductor layer, such that a plurality of active layers spaced apart from each other are formed on each of the plurality of semiconductor light emitting devices.

In some implementations, each of the semiconductor light emitting devices may further include a first conductive electrode disposed on the first conductive semiconductor layer, and a plurality of second conductive electrodes disposed on the plurality of second conductive semiconductor layers, respectively. Each of the plurality of second conductive semiconductor layers may be electrically connected to one of the electrode lines.

In some implementations, the plurality of second conductive semiconductor layers may be connected in parallel to the same electrode line.

In some implementations, the plurality of second conductive semiconductor layers may be electrically connected to different electrode lines.

In some implementations, the plurality of second conductive semiconductor layers may be disposed at one surface of both surfaces of the first conductive semiconductor layer, and the first conductive electrode may be disposed on the one surface, of the both surfaces of the first conductive semiconductor layer, where the plurality of second conductive semiconductor layers are disposed.

In some implementations, the plurality of second conductive semiconductor layers may be disposed at one surface of both surfaces of the first conductive semiconductor layer, and the first conductive electrode may be disposed on a remaining one surface of the both surfaces of the first conductive semiconductor layer that is different from the one surface where the plurality of second conductive semiconductor layers are disposed.

According to another aspect, a semiconductor light emitting device includes a first conductive semiconductor layer, a second conductive semiconductor layer formed on the first conductive semiconductor layer, and an active layer formed between the first and second conductive semiconductor layers. The second conductive semiconductor layer is provided in plurality on the first conductive semiconductor layer, such that a plurality of active layers spaced apart from each other are formed on the semiconductor light emitting device.

Advantageous Effects of Invention

As a semiconductor light emitting device according to the present disclosure includes a plurality of light emitting regions, light emitting ability of the semiconductor light emitting device can be maintained even when one of the light emitting regions loses its light emitting ability. Accordingly, there is no need to dispose a plurality of semiconductor light emitting devices for each sub-pixel in preparation for semiconductor light emitting device damage. Thus, a high-resolution display with a very small distance between semiconductor light emitting devices can be achieved.

MODE FOR THE INVENTION

Description will now be given in detail according to exemplary implementations disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the main point of the present disclosure, such explanation has been omitted but would be understood by those skilled in the art. The accompanying drawings are used to help easily understand the technical idea of the present disclosure and it should be understood that the idea of the present disclosure is not limited by the accompanying drawings.

It will be understood that when an element such as a layer, area or substrate is referred to as being "on" another element, it can be directly on the element, or one or more intervening elements may also be present.

A display device disclosed herein may include a mobile phone, a smart phone, a laptop computer, a digital broadcast terminal, a personal digital assistant (PDA), a portable multimedia player (PMP), a navigation device, a slate PC, a tablet PC, an ultrabook, a digital TV, a desktop computer, and the like. However, it will be readily apparent to those skilled in the art that the configuration according to the implementations described herein may also be applied to a new product type of display device that will be developed later.

Figure 1:
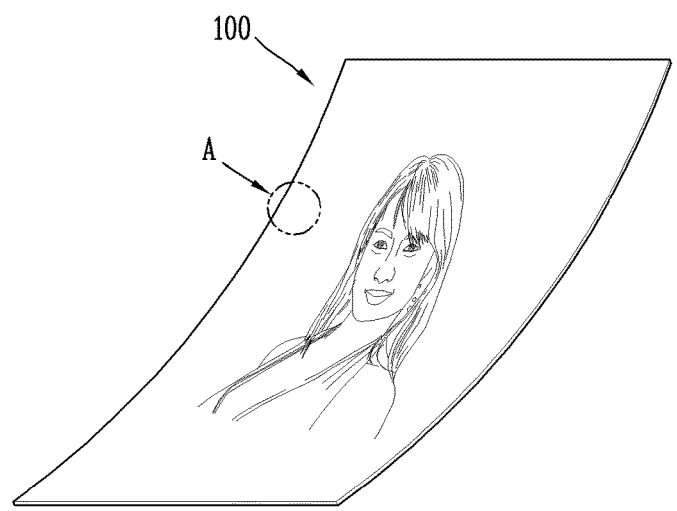
FIG. 1 is a conceptual view illustrating a display device using a semiconductor light emitting device (diode) according to one implementation of the present disclosure.

FIG. 1 is a conceptual view illustrating a display device using a semiconductor light emitting device (diode) according to one implementation of the present disclosure.

As illustrated, information processed in a controller (or control unit) of a display device 100 may be displayed using a flexible display.

The flexible display may include a flexible, bendable, twistable, foldable, and rollable display. For example, the flexible display may be a display fabricated on a thin and flexible substrate that can be warped, bent, folded, or rolled like a paper sheet while maintaining the display characteristics of a flat display of the related art.

A display area of the flexible display becomes a plane in a state or configuration that the flexible display is not warped (e.g., a configuration having an infinite radius of curvature, hereinafter, referred to as a "first configuration"). The display area of the flexible display becomes a curved surface in a configuration that the flexible display is warped by an external force in the first configuration (e.g., a configuration having a finite radius of curvature, hereinafter, referred to as a "second configuration"). As illustrated in the drawing, information displayed in the second state may be visual information output on a curved surface. Such visual information is realized by independently controlling emission of sub-pixels (unit pixels) arranged in a matrix form. The sub-pixel denotes an elementary unit for representing one color.

The sub-pixel of the flexible display may be implemented by a semiconductor light emitting device. The present disclosure exemplarily illustrates a light emitting diode (LED) as a type of semiconductor light emitting device for converting current into light. The light emitting diode may have a small size to thereby serve as a sub-pixel even in the second configuration.

Hereinafter, a flexible display implemented using the light emitting diode will be described in more detail with reference to the accompanying drawings.

Figure 2:
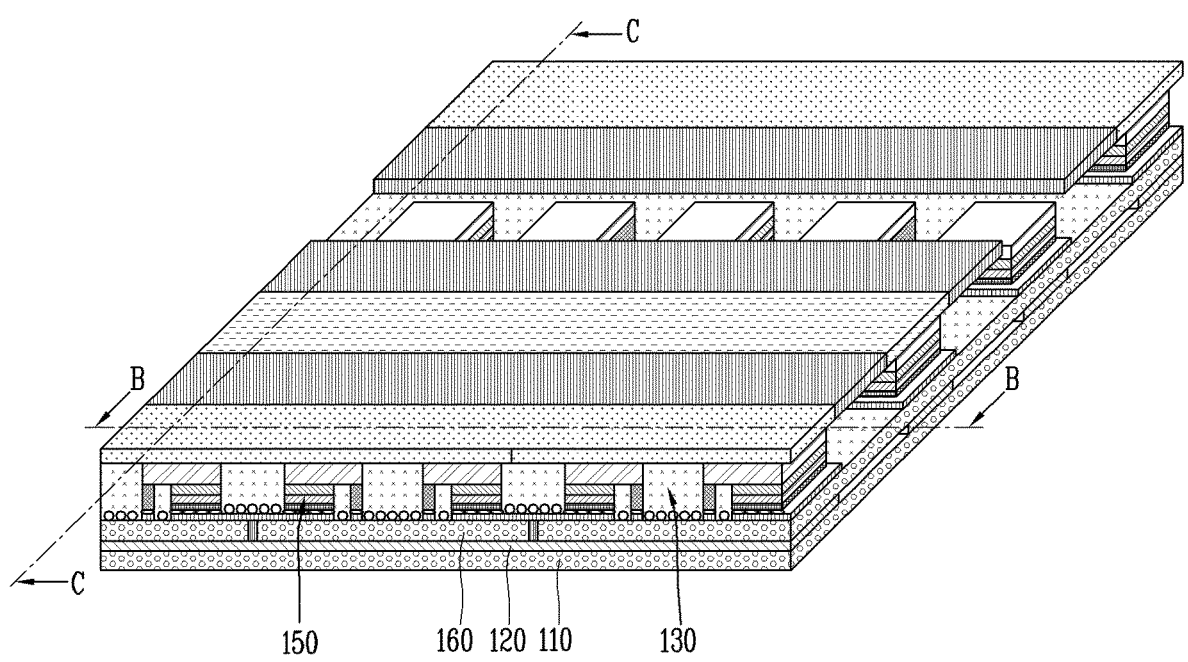
FIG. 2 is a partially enlarged view illustrating a portion "A" of FIG. 1.
Figure 3A:
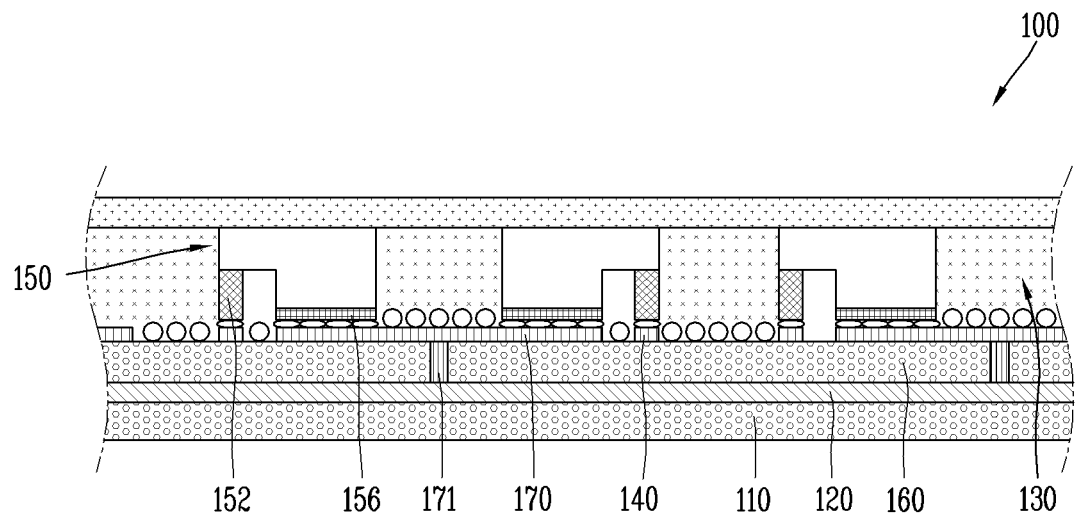
FIGS. 3A and 3B are cross-sectional views taken along the lines "B-B" and "C-C" of FIG. 2.
Figure 3B:
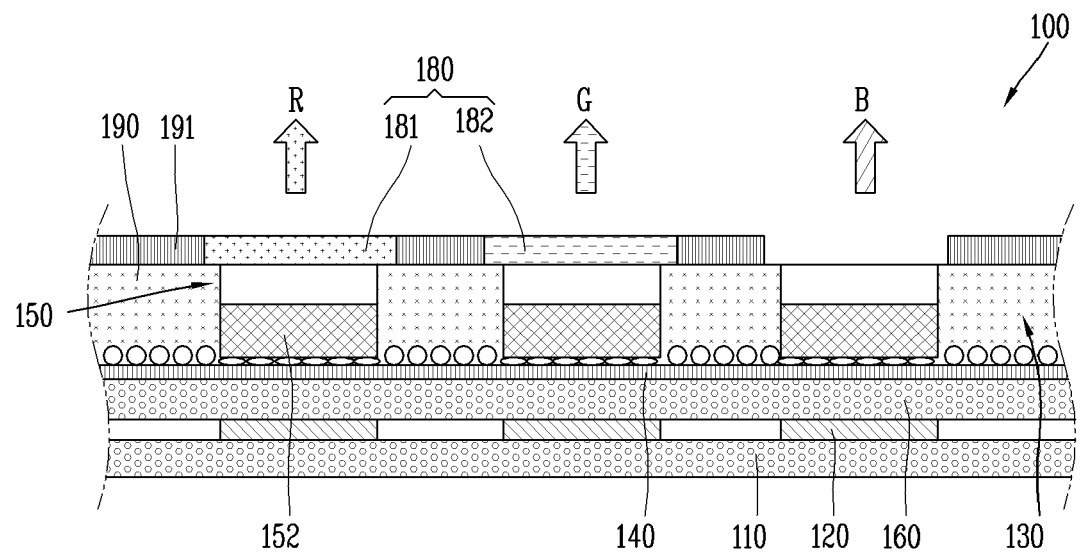
Figure 4:
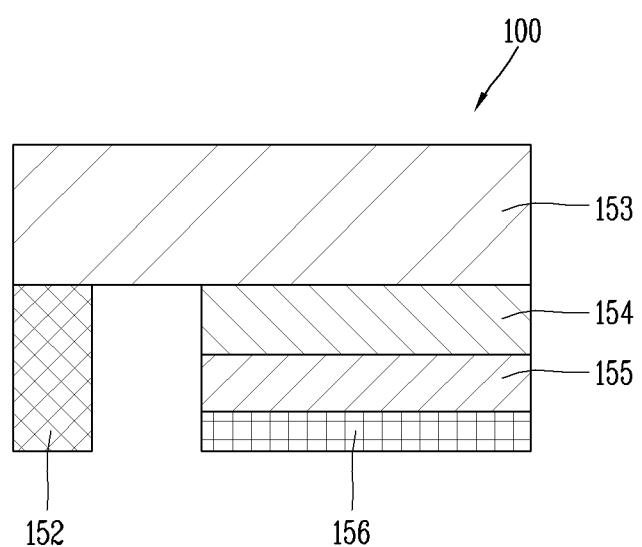
FIG. 4 is a conceptual view illustrating a flip chip type semiconductor light emitting device of FIG. 3.

FIG. 2 is a partially enlarged view illustrating a portion "A" of FIG. 1, and FIGS. 3A and 3B are cross-sectional views taken along the lines "B-B" and "C-C" of FIG. 2, FIG. 4 is a conceptual view illustrating a flip chip type semiconductor light emitting device of FIG. 3, and FIGS. 5A to 5C are conceptual views illustrating various forms of realizing a color in association with a flip chip type semiconductor light emitting device.

Referring to FIGS. 2, 3A, and 3B, a display device using a passive matrix (PM) type semiconductor light emitting device is used as a display device 100 using a semiconductor light emitting device. However, an example described hereinafter may also be applied to an active matrix (AM) type semiconductor light emitting device.

The display device 100 may include a first substrate 110, a first electrode 120, a conductive adhesive layer 130, a second electrode 140, and a plurality of semiconductor light emitting devices 150.

The first substrate 110 may be a flexible substrate. The first substrate 110 may contain glass or polyimide (PI) to implement the flexible display device, for example. The first substrate 110 may alternatively be made of any material with an insulating property and flexibility such as polyethylene naphthalate (PEN), polyethylene terephthalate (PET), and the like. In addition to, the first substrate 110 may be either one of transparent and non-transparent materials.

The first substrate 110 may be a wiring substrate provided with the first electrode 120, and thus, the first electrode 120 may be placed on the first substrate 110.

As illustrated, an insulating layer 160 may be disposed on the first substrate 110 on which the first electrode 120 is located, and an auxiliary electrode 170 may be disposed on the insulating layer 160. Here, a configuration in which the insulating layer 160 is disposed on the first substrate 110 may be a single wiring substrate. More specifically, the insulating layer 160 may be made of a flexible insulating material, such as polyimide (PI), PET, and PEN, and may be formed integrally with the first substrate 110 to define a single substrate.

The auxiliary electrode 170 is an electrode that electrically connects the first electrode 120 and the semiconductor light emitting device 150, and is disposed on the insulating layer 160 to correspond to a position of the first electrode 120. For example, the auxiliary electrode 170 may have a dot-like shape and may be electrically connected to the first electrode 120 by an electrode hole 171 formed through the insulating layer 160. The electrode hole 171 may be formed by filling a conductive material into a via hole.

Referring to the drawings, the conductive adhesive layer 130 may be formed on one surface of the insulating layer 160, but the present disclosure may not be necessarily limited to this. For example, a layer serving as a specific function may be disposed between the insulating layer 160 and the conductive adhesive layer 130, or the conductive adhesive layer 130 may be disposed on the first substrate 110 without the insulating layer 160. The conductive adhesive layer 130 may perform the role of an insulating layer in a structure in which the conductive adhesive layer 130 is disposed on the first substrate 110.

The conductive adhesive layer 130 may be a layer having adhesiveness and conductivity, and to this end, a conductive material and an adhesive material may be mixed for the conductive adhesive layer 130. In addition, the conductive adhesive layer 130 may have flexibility to thereby enable a flexible function in the display device.

For such an example, the conductive adhesive layer 130 may be an anisotropic conductive film (ACF), an anisotropic conductive paste, a solution containing conductive particles, and the like. The conductive adhesive layer 130 may allow electrical interconnection in a z-direction passing through the thickness thereof, but may be configured as a layer having electrical insulation in a horizontal x-y direction. Accordingly, the conductive adhesive layer 130 may be referred to as a z-axis conductive layer (hereinafter referred to as a 'conductive adhesive layer').

The anisotropic conductive film is a film in which an anisotropic conductive medium is mixed with an insulating base member. When heat and pressure are applied, only a specific portion has conductivity by the anisotropic conductive medium. Hereinafter, a description will be given of an example in which heat and pressure are both applied to the anisotropic conductive film, but other methods may alternatively be used to allow the anisotropic conductive film to partially have conductivity. Such methods may include applying either the heat or the pressure, a UV curing method, and the like.

In addition, the anisotropic conductive medium may be, for example, a conductive ball or a conductive particle. In this implementation, the anisotropic conductive film is a film in which conductive balls are mixed with an insulating base member. When heat and pressure are applied, only a specific portion of the anisotropic conductive film obtains conductivity by the conductive balls. The anisotropic conductive film may be a state of containing a plurality of particles each of which a core of a conductive material is coated with an insulating film made of a polymer material. At this time, a portion of the insulating film to which heat and pressure have been applied is broken to thereby obtain conductivity by the core. Here, the shape of the core may be deformed to form a layer in contact with the film in a thickness direction. As a more specific example, heat and pressure are applied to the entire anisotropic conductive film, and an electric connection in the z-axis direction is partially formed by a height difference of an object adhered by the anisotropic conductive film.

As another example, the anisotropic conductive film may be a state of containing a plurality of particles each of which the insulating core is coated with the conductive material. In this case, a portion of the conductive material to which the heat and pressure have been applied is deformed (stuck), and thus the portion has conductivity in the thickness direction of the film. As another example, the conductive material may penetrate through the insulating base member in the z-axis direction such that the film has conductivity in its thickness direction. In this case, the conductive material may have a sharp end portion.

As illustrated, the anisotropic conductive film may be a fixed array anisotropic conductive film (ACF) in which conductive balls are inserted into one surface of the insulating base member. More specifically, the insulating base member is made of a material having adhesiveness, and the conductive balls are concentrated on a bottom portion of the insulating base member. When heat and pressure are applied to the base member, the base member is deformed together with the conductive balls to thereby obtain conductivity in a perpendicular direction.

However, the present disclosure is not limited thereto. The anisotropic conductive film may alternatively be formed by randomly inserting conductive balls into the insulating base member, or may be configured in the form of double-ACF in which a plurality of layers are provided and the conductive balls are disposed in one of the layers.

The anisotropic conductive paste that is a combination of a paste and conductive balls may be a paste in which conductive balls are mixed with a base material having insulating property and adhesiveness. In addition, the solution containing conductive particles may be a solution in which conductive particles or nano particles are contained.

Referring to the drawing again, the second electrode 140 is located on the insulating layer 160 with being spaced apart from the auxiliary electrode 170. In other words, the conductive adhesive layer 130 is disposed on the insulating layer 160 where the auxiliary electrode 170 and second electrode 140 are located.

When the conductive adhesive layer 130 is formed in a state that the auxiliary electrode 170 and second electrode 140 are located on the insulating layer 160, and then heat and pressure are applied to connect the semiconductor light emitting device 150 in a flip chip form, the semiconductor light emitting device 150 is electrically connected to the first electrode 120 and second electrode 140.

Referring to FIG. 4, the semiconductor light emitting device may be a flip chip type light emitting device.

For example, the semiconductor light emitting device includes a p-type electrode 156, a p-type semiconductor layer 155 provided with the p-type electrode 156, an active layer 154 disposed on the p-type semiconductor layer 155, an n-type electrode 153 disposed on the active layer 154, and an n-type electrode 152 disposed on the n-type semiconductor layer 153 with being spaced apart from the p-type electrode 156 in a horizontal direction. Here, the p-type electrode 156 may be electrically connected to the auxiliary electrode 170 by the conductive adhesive layer 130, and the n-type electrode 152 may be electrically connected to the second electrode 140.

Referring back to FIGS. 2, 3A, and 3B, the auxiliary electrode 170 may be formed long in one direction, and one auxiliary electrode may be electrically connected to the plurality of semiconductor light emitting devices 150. For example, p-type electrodes of the left and right semiconductor light emitting devices based on the auxiliary electrode may be electrically connected to one auxiliary electrode.

More specifically, the semiconductor light emitting device 150 is press-fitted into the conductive adhesive layer 130 by heat and pressure. Accordingly, only a portion between the p-type electrode 156 and auxiliary electrode 170 of the semiconductor light emitting device 150, and a portion between the n-type electrode 152 and second electrode 140 of the semiconductor light emitting device 150 have conductivity, and the remaining portion does not have conductivity since there is no press-fitting of the semiconductor light emitting device. As such, the conductive adhesive layer 130 provides a mutual coupling as well as electrical connection between the semiconductor light emitting device 150 and the auxiliary electrode 170, and between the semiconductor light emitting device 150 and the second electrode 140.

In addition, the plurality of semiconductor light emitting devices 150 constitute a light emitting device array, and a phosphor layer 180 is formed on the light emitting device array.

The light emitting device array may include a plurality of semiconductor light emitting devices having different luminance values. Each of the semiconductor light emitting devices 150 constitutes a sub-pixel and is electrically connected to the first electrode 120. For example, the first electrode 120 may be provided in plurality. The semiconductor light emitting devices, for example, may be arranged in several rows, and the semiconductor light emitting devices in each row may be electrically connected to one of the plurality of first electrodes.

In addition, since the semiconductor light emitting devices are connected in the form of a flip chip, the semiconductor light emitting devices grown on a transparent dielectric substrate can be used. The semiconductor light emitting devices may be, for example, nitride semiconductor light emitting devices. Since the semiconductor light emitting device 150 has excellent luminance, it can constitute an individual sub-pixel even though it is small in size.

As illustrated, a partition wall 190 may be formed between the semiconductor light emitting devices 150. In this case, the partition wall 190 may perform the role of dividing individual sub-pixels from one another, and be formed as an integral body with the conductive adhesive layer 130. For example, a base member of the anisotropic conductive film may form the partition wall when the semiconductor light emitting device 150 is inserted into the anisotropic conductive film.

When the base member of the anisotropic conductive film is black, the partition wall 190 may have reflective characteristics and also increase contrast even without an additional black insulator.

As another example, a reflective partition wall may be separately provided as the partition wall 190. In this case, the partition wall 190 may include a black or white insulator according to the purpose of the display device. Reflectivity can be enhanced when the partition wall of the white insulator is used, and reflective characteristics can be obtained and contrast can be increased as well when the partition wall of the black insulator is used.

The phosphor layer 180 may be located at an outer surface of the semiconductor light emitting device 150. For example, the semiconductor light emitting device 150 is a blue semiconductor light emitting device that emits blue (B) light, and the phosphor layer 180 performs the role of converting the blue (B) light into a color of a sub-pixel. The phosphor layer 180 may be a red phosphor layer 181 or a green phosphor layer 182 constituting individual pixels.

In other words, a red phosphor 181 capable of converting blue light into red (R) light may be stacked or disposed on the blue semiconductor light emitting device 151 at a location implementing a red sub-pixel, and a green phosphor 182 capable of converting blue light into green (G) light may be disposed on the blue semiconductor light emitting device 151 at a location implementing a green sub-pixel. In addition, only the blue semiconductor light emitting device 151 may be solely used at a location implementing a blue sub-pixel. In this case, the red (R), green (G), and blue (B) sub-pixels may implement one pixel. More specifically, one color phosphor may be disposed along each line of the first electrode 120. Accordingly, one line on the first electrode 120 may be an electrode controlling one color. In other words, red (R), green (B), and blue (B) may be sequentially arranged along the second electrode 140, thereby implementing sub-pixels.

However, the present disclosure may not be necessarily limited to this, and the semiconductor light emitting device 150 may be combined with a quantum dot (QD) instead of the phosphor to implement red (R), green (G), and blue (B) sub-pixels.

In addition, a black matrix 191 may be disposed between each of the phosphor layers to enhance contrast. In other words, the black matrix 191 can enhance the contrast of luminance.

However, the present disclosure may not be necessarily limited to this, and another structure for implementing blue, red, and green lights may be also applicable thereto.

Figure 5A:
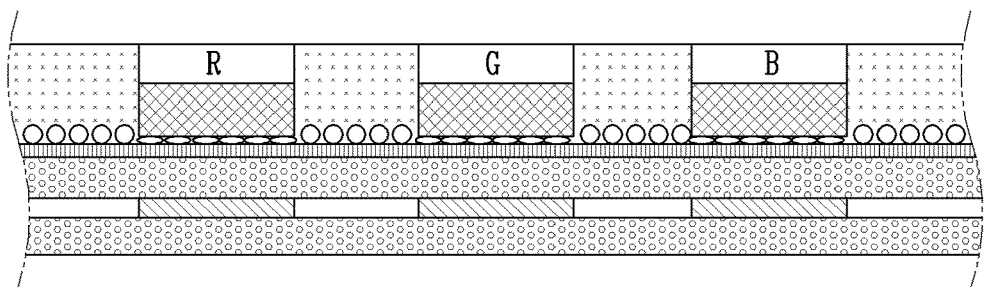
FIGS. 5A to 5C are conceptual views illustrating various forms of realizing a color in association with a flip chip type semiconductor light emitting device.

Referring to FIG. 5A, each of the semiconductor light emitting devices 150 may be implemented as a high-power light emitting device that emits various light including blue light in a manner that gallium nitride (GaN) is mostly used, and indium (In) and or aluminum (Al) are added thereto.

In this case, the semiconductor light emitting devices 150 may be red, green, and blue semiconductor light emitting devices, respectively, to implement each sub-pixel. For instance, red, green, and blue semiconductor light emitting devices (R, G, B) are alternately disposed, and red, green, and blue sub-pixels implement one pixel by the red, green, and blue semiconductor light emitting devices, thereby achieving a full color display.

Figure 5B:
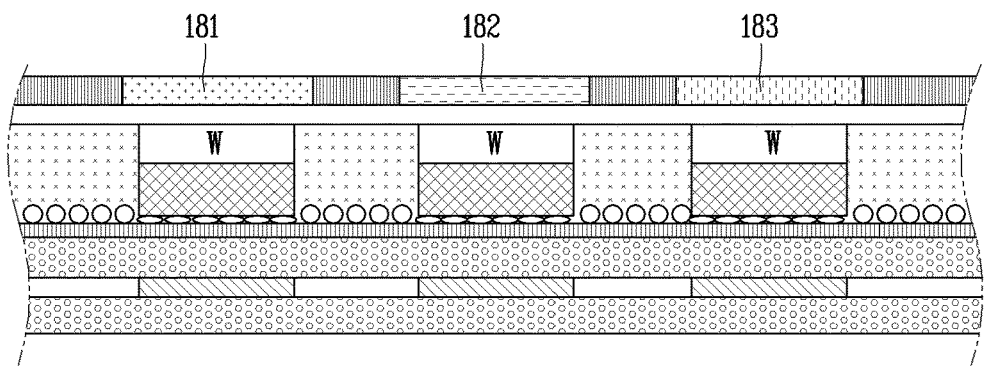

Referring to FIG. 5B, the semiconductor light emitting device may have a white light emitting device (W) provided with a yellow phosphor layer for each device. In this case, a red phosphor layer 181, a green phosphor layer 182, and a blue phosphor layer 183 may be provided on the white light emitting device (VV) to implement a sub-pixel. Further, the sub-pixel may be formed by using a color filter repeated with red, green, and blue on the white light emitting device (W).

Figure 5C:
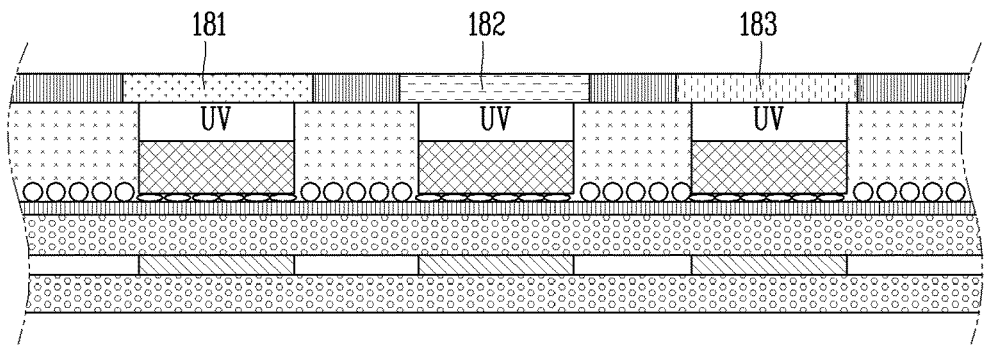

Referring to FIG. 5C, a structure in which a red phosphor layer 181, a green phosphor layer 182, and a blue phosphor layer 183 are provided on a ultra violet light emitting device (UV) is also available. In this manner, the semiconductor light emitting device can be used over the entire region up to ultra violet (UV) as well as visible light, and can be extensively used in the form of a semiconductor light emitting device in which ultra violet (UV) is used as an excitation source.

Returning back to the implementation, the semiconductor light emitting device 150 is located on the conductive adhesive layer 130 to configure a sub-pixel in the display device. The semiconductor light emitting device 150 has excellent luminance to thereby configure an individual sub-pixel even it is small size. The size of the individual semiconductor light emitting device 150 may be less than 80 μm in the length of one side thereof, and may be a rectangular or square shaped device. In the case of a rectangular shaped device, its size may be less than 20×80 μm.

Further, even when a square shaped semiconductor light emitting device 150 with the length of one side of 10 μm is used as a sub-pixel, it will exhibit sufficient brightness for implementing a display device. Taking a rectangular pixel as an example, when one side of a sub-pixel is 600 μm and the other side thereof is 300 μm, a distance between the semiconductor light emitting devices is relatively sufficiently large. Accordingly, a flexible display device having an HD image quality can be achieved.

A display device using the semiconductor light emitting device described above may be manufactured by a new type of manufacturing method. Hereinafter, the manufacturing method will be described with reference to FIG. 6.

Figure 6:
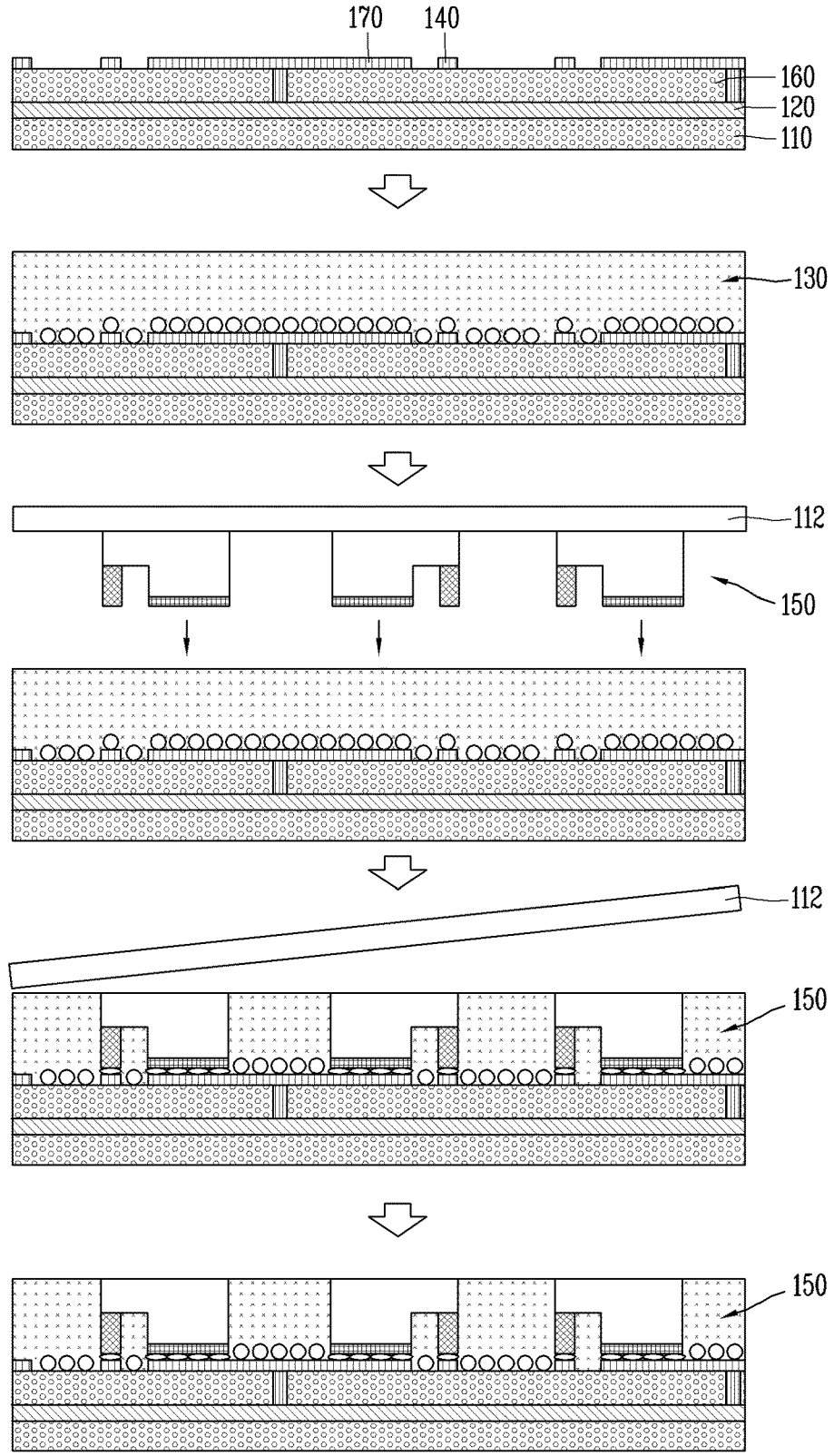
FIG. 6 is a cross-sectional view illustrating a method of manufacturing a display device using a semiconductor light emitting device according to the present disclosure.

FIG. 6 is a cross-sectional view illustrating a method of manufacturing a display device using a semiconductor light emitting device according to the present disclosure.

Referring to the drawing, first, a conductive adhesive layer 130 is formed on an insulating layer 160 where an auxiliary electrode 170 and a second electrode 140 are located. The insulating layer 160 is disposed on a first substrate 110 to form one substrate (or wiring substrate), and a first electrode 120, the auxiliary electrode 170, and the second electrode 140 are disposed at the wiring substrate. In this case, the first electrode 120 and second electrode 140 may be disposed in an orthogonal direction to each other. In addition, the first substrate 110 and the insulating layer 160 may each contain glass or polyimide (PI) to implement a flexible display device.

The conductive adhesive layer 130 may be implemented by an anisotropic conductive film, for example. To this end, an anisotropic conductive film may be coated on the substrate where the insulating layer 160 is located.

Next, a second substrate 112 having a plurality of semiconductor light emitting devices 150 that correspond to locations of the auxiliary electrodes 170 and second electrodes 140 and constitute individual pixels is disposed such that the semiconductor light emitting devices 150 face the auxiliary electrodes 170 and the second electrodes 140.

In this case, the second substrate 112, which is a growth substrate for growing the semiconductor light emitting device 150, may be a sapphire substrate or silicon substrate.

The semiconductor light emitting device may have a gap and size capable of implementing a display device when formed in the wafer unit, thereby being effectively used for the display device.

Next, the wiring substrate and the second substrate 112 are thermally compressed together. For example, the wiring substrate and second substrate 112 may be thermally compressed to each other by using an ACF press head. The wiring substrate and second substrate 112 are bonded together by the thermal compression. Only portions between the semiconductor light emitting device 150 and the auxiliary electrode 170, and between the semiconductor light emitting device 150 and the second electrode 140 may have conductivity due to the characteristics of an anisotropic conductive film having conductivity by thermal compression, thereby allowing the electrodes and the semiconductor light emitting device 150 to be electrically connected to each other. Here, the semiconductor light emitting device 150 may be inserted into the anisotropic conductive film to thereby define a partition wall between the semiconductor light emitting devices 150.

Next, the second substrate 112 is removed. For example, the second substrate 112 may be removed using a laser lift-off (LLO) method or a chemical lift-off (CLO) method.

Finally, the second substrate 112 is removed to expose the semiconductor light emitting devices 150 to the outside. Silicon oxide (SiOx) or the like may be coated on the wiring substrate coupled to the semiconductor light emitting device 150 to form a transparent insulating layer (not shown).

In addition, a step (or process) of forming a phosphor layer on one surface of the semiconductor light emitting device 150 may be further included. For example, the semiconductor light emitting device 150 may be a blue semiconductor light emitting device that emits blue (B) light, and a red or green phosphor for converting the blue (B) light into the color of the sub-pixel may form a layer on one surface of the blue semiconductor light emitting device.

The manufacturing method or structure of the display device using the semiconductor light emitting device described above may be modified in various forms. For such an example, a vertical semiconductor type light emitting device may also be employed in the aforementioned display device. Hereinafter, the vertical structure will be described with reference to FIGS. 5 and 6.

Further, according to the following modified example or implementation, the same or similar reference numerals are designated to the same or similar configurations to the previous example, and a description thereof will be substituted by the earlier description.

Figure 7:
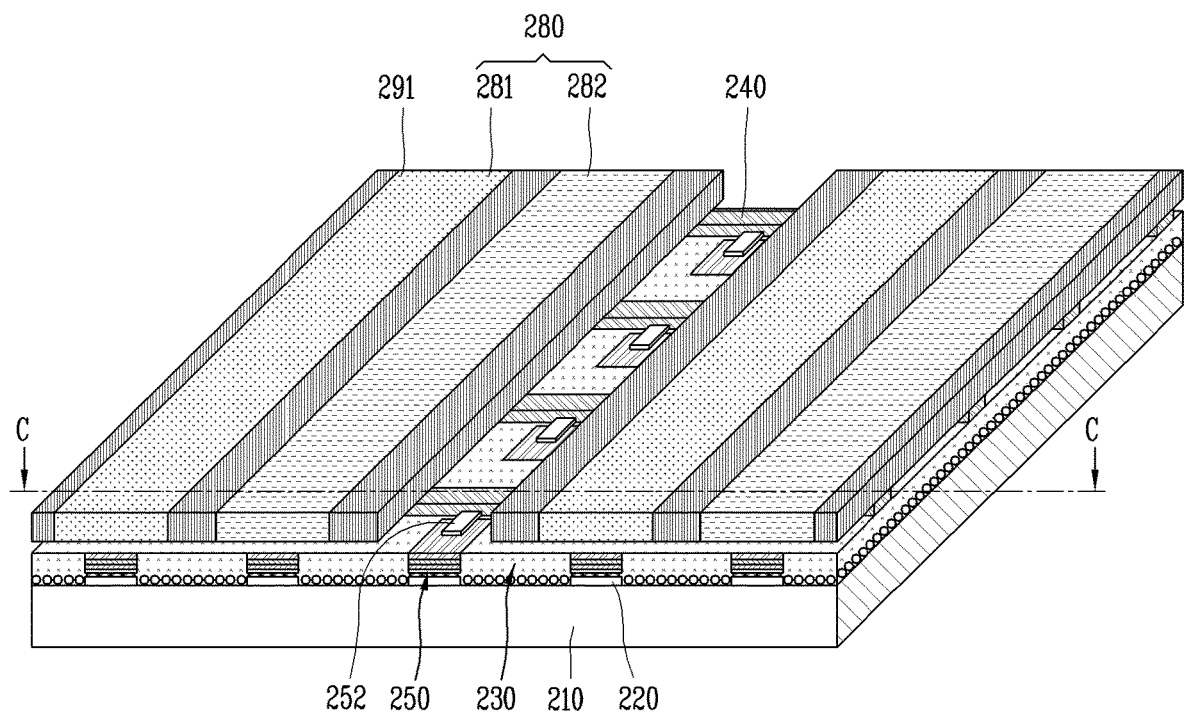
FIG. 7 is a perspective view illustrating a display device using a semiconductor light emitting device according to another implementation of the present disclosure.
Figure 8:
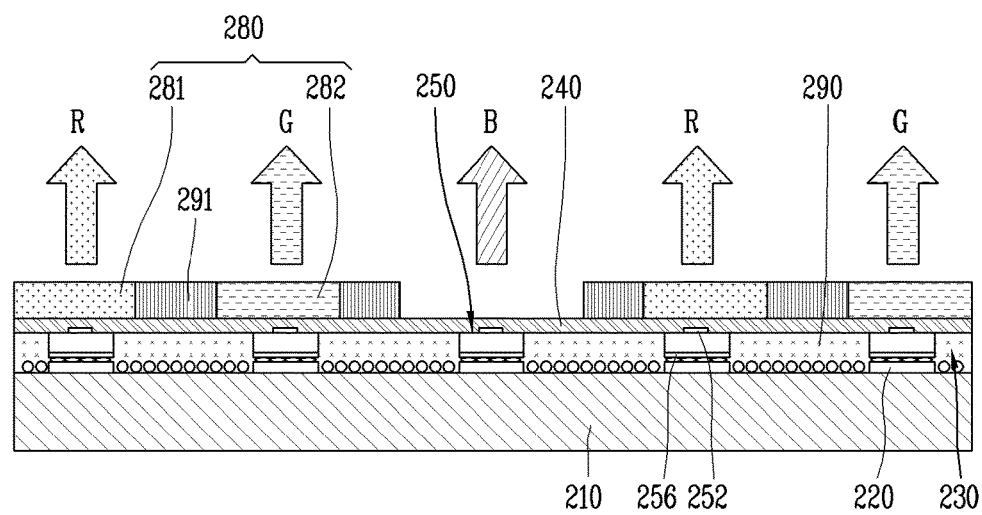
FIG. 8 is a cross-sectional view taken along the line "D-D" of FIG. 7.
Figure 9:
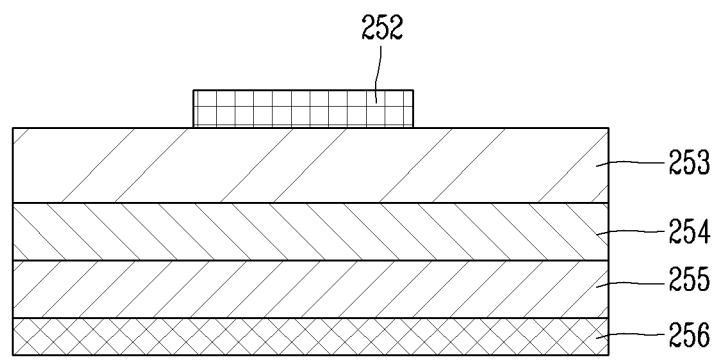
FIG. 9 is a conceptual view illustrating a vertical type semiconductor light emitting device of FIG. 8.

FIG. 7 is a perspective view illustrating a display device using a semiconductor light emitting device according to another implementation of the present disclosure, FIG. 8 is a cross-sectional view taken along the line "D-D" of FIG. 7, and FIG. 9 is a conceptual view illustrating a vertical type semiconductor light emitting device of FIG. 8.

Referring to the drawings, the display device may be a display device using a passive matrix (PM) type of a vertical semiconductor light emitting device.

The display device may include a substrate 210, a first electrode 220, a conductive adhesive layer 230, a second electrode 240, and a plurality of semiconductor light emitting devices 250.

The substrate 210, which is a wiring substrate on which the first electrode 220 is disposed, may include polyimide (PI) to implement a flexible display device. In addition to, any material may be used if it is an insulating and flexible material.

The first electrode 220 may be located on the substrate 210 and formed in a shape of a long bar in one direction. The first electrode 220 may serve as a data electrode.

The conductive adhesive layer 230 is formed on the substrate 210 where the first electrode 220 is located. Similar to the display device in which a flip chip type light emitting device is employed, the conductive adhesive layer 230 may be an anisotropic conductive film (ACF), an anisotropic conductive paste, a solution containing conductive particles, or the like. However, this implementation illustrates a case in which the conductive adhesive layer 230 is implemented by an anisotropic conductive film.

When an anisotropic conductive film is disposed in a state that the first electrode 220 is located on the substrate 210, and then heat and pressure are applied to connect the semiconductor light emitting device 250, the semiconductor light emitting device 250 is electrically connected to the first electrode 220. Here, the semiconductor light emitting device 250 may be, preferably, disposed on the first electrode 220.

The electrical connection is achieved when heat and pressure are applied because an anisotropic conductive film partially has conductivity in the thickness direction, as described above. Accordingly, the anisotropic conductive film is divided into a portion having conductivity and a portion having no conductivity in the thickness direction thereof.

Further, the anisotropic conductive film contains an adhesive component, and thus the conductive adhesive layer 230 provides not only a mechanical coupling but also an electrical connection between the semiconductor light emitting device 250 and the first electrode 220.

In this manner, the semiconductor light emitting device 250 is placed on the conductive adhesive layer 230 to thereby configure a separate sub-pixel in the display device. Since the semiconductor light emitting device 250 has excellent luminance, it can constitute an individual sub-pixel even though it is small in size. The size of the individual semiconductor light emitting device 250 may be less than 80 μm in the length of one side thereof, and may be a rectangular or square shaped device. In the case of a rectangular shaped device, its size may be less than 20×80 μm.

The semiconductor light emitting device 250 may be a vertical structure.

A plurality of second electrodes 240 that are disposed in a direction crossing a lengthwise direction of the first electrode 220 and are electrically connected to the vertical semiconductor light emitting device 250 may be located between vertical semiconductor light emitting devices.

Referring to FIG. 9, the vertical type semiconductor light emitting device includes a p-type electrode 256, a p-type semiconductor layer 255 formed on the p-type electrode 256, an active layer 254 formed on the p-type semiconductor layer 255, an n-type semiconductor layer 253 formed on the active layer 254, and an n-type electrode 252 formed on the n-type semiconductor layer 253. Here, the p-type electrode 256 located at the bottom may be electrically connected to the first electrode 220 by the conductive adhesive layer 230, and the n-type electrode 252 located at the top may be electrically connected to the second electrode 240 to be described hereinafter. The electrodes may be disposed in an up-and-down direction in the vertical type semiconductor light emitting device 250 to thereby provide a great advantage of reducing the chip size.

Referring back to FIG. 8, a phosphor layer 280 may be formed on one surface of the semiconductor light emitting device 250. For example, the semiconductor light emitting device 250 is a blue semiconductor light emitting device 251 that emits blue (B) light, and the phosphor layer 280 for converting the blue (B) light into the color of the sub-pixel may be provided thereon. In this case, the phosphor layer 280 may be a red phosphor 281 and a green phosphor 282 constituting individual pixels.

In other words, a red phosphor 281 capable of converting blue light into red (R) light may be disposed on the blue semiconductor light emitting device 251 at a location implementing a red sub-pixel, and a green phosphor 282 capable of converting blue light into green (G) light may be disposed on the blue semiconductor light emitting device 251 at a location implementing a green sub-pixel. In addition, only the blue semiconductor light emitting device 251 may be solely used at a location implementing a blue sub-pixel. In this case, the red (R), green (G), and blue (B) sub-pixels may implement one pixel.

However, the present disclosure may not be necessarily limited to this, and other structures for implementing blue, red, and green may be also applicable as described above in the display device in which a flip chip type light emitting device is employed.

In this implementation, the second electrode 240 is located between the semiconductor light emitting devices 250, and is electrically connected to the semiconductor light emitting devices 250. For example, the semiconductor light emitting devices 250 may be disposed in a plurality of rows, and the second electrode 240 may be disposed between the rows of the semiconductor light emitting devices 250.

Since a distance between the semiconductor light emitting devices 250 constituting individual pixels is sufficiently large, the second electrode 240 may be located between the semiconductor light emitting devices 250.

The second electrode 240 may be formed as a bar-shaped electrode elongated in one direction and disposed in a direction perpendicular to the first electrode.

Further, the second electrode 240 may be electrically connected to the semiconductor light emitting device 250 by a connecting electrode that protrudes from the second electrode 240. More specifically, the connecting electrode may be an n-type electrode of the semiconductor light emitting device 250. For example, the n-type electrode is formed as an ohmic electrode for ohmic contact, and the second electrode covers at least part of the ohmic electrode by printing or deposition. Accordingly, the second electrode 240 may be electrically connected to the n-type electrode of the semiconductor light emitting device 250.

As illustrated, the second electrode 240 may be located on the conductive adhesive layer 230. In some implementations, a transparent insulating layer (not shown) containing silicon oxide (SiOx) may be formed on the substrate 210 provided with the semiconductor light emitting device 250. When the transparent insulating layer is formed and then the second electrode 240 is placed thereon, the second electrode 240 may be located on the transparent insulating layer. In addition, the second electrode 240 may be spaced apart from the conductive adhesive layer 230 or the transparent insulating layer.

If a transparent electrode such as indium tin oxide (ITO) is used to locate the second electrode 240 on the semiconductor light emitting device 250, the ITO material has bad adhesiveness with an n-type semiconductor. In the present disclosure, as the second electrode 240 is placed between the semiconductor light emitting devices 250, a transparent electrode such as an ITO is not required. Therefore, an n-type semiconductor layer and a conductive material having good adhesiveness may be used as a horizontal electrode without being restricted by the selection of a transparent material, thereby enhancing the light extraction efficiency.

As illustrated, a partition wall 290 may be disposed between the semiconductor light emitting devices 250. In other words, the partition wall 290 may be disposed between the vertical semiconductor light emitting devices 250 to isolate the semiconductor light emitting devices 250 constituting individual pixels. In this case, the partition wall 290 may serve to divide individual sub-pixels from one another, and be formed as an integral body with the conductive adhesive layer 230. For example, a base member of the anisotropic conductive film may define the partition wall when the semiconductor light emitting device 250 is inserted into the anisotropic conductive film.

When the base member of the anisotropic conductive film is black, the partition wall 290 may have reflective characteristics and increase contrast as well even without an additional black insulator.

As another example, a reflective partition wall may be separately provided as the partition wall 290. In this case, the partition wall 290 may include a black or white insulator according to the purpose of the display device.

If the second electrode 240 is directly located on the conductive adhesive layer 230 between the semiconductor light emitting devices 250, the partition wall 290 may be located between the semiconductor light emitting device 250 and the second electrode 240. Accordingly, individual subpixels may be configured even with a small size using the semiconductor light emitting device 250, and a distance between the semiconductor light emitting devices 250 may be relatively sufficiently large to place the second electrode 240 between the semiconductor light emitting devices 250, thereby achieving a flexible display device having a HD image quality.

Further, according to the drawing, a black matrix 291 may be disposed between each of the phosphor layers to enhance contrast. In other words, the black matrix 291 can enhance the contrast of luminance.

In this manner, the semiconductor light emitting device 250 is placed on the conductive adhesive layer 230 to thereby configure a separate sub-pixel in the display device. Since the semiconductor light emitting device 250 has excellent luminance, it can constitute an individual sub-pixel even though it is small in size. As a result, a full color display in which the sub-pixels of red (R), green (G), and blue (B) implement one pixel by the semiconductor light emitting device can be achieved.

Meanwhile, the semiconductor light emitting devices provided in the display device described with reference to FIGS. 1 to 9 are formed on a wafer. In detail, conductive semiconductor layers are sequentially disposed on a wafer to fabricate individual semiconductor light emitting devices through an isolation process and a mesa process. Hereinafter, a method of fabricating the flip chip type semiconductor light emitting device described with reference to FIG. 4 will be described in detail. However, the present disclosure may be applied not only to the flip chip type semiconductor light emitting device, but also to the vertical type semiconductor light emitting device described with reference to FIG. 9.

In detail, a growth substrate (wafer) may be made of a light transmissive material, for example, one of sapphire (Al2O3), GaN, ZnO, and AlO, but the present disclosure is not limited thereto. In addition, the growth substrate may be made of a material suitable for growing a semiconductor material, namely, a carrier wafer. The growth substrate may also be formed of a material having high thermal conductivity. The growth substrate may use at least one of a SiC substrate having higher thermal conductivity than the sapphire (Al2O3) substrate, Si, GaAs, GaP, InP, and Ga2O3, in addition to a conductive substrate or an insulating substrate.

Next, at least portions or parts of a first conductive semiconductor layer, an active layer, and a second conductive semiconductor layer are removed to form a plurality of semiconductor light emitting devices.

More specifically, isolation is performed such that the plurality of light emitting devices form an array with an epi-chip. That is, the first conductive semiconductor layer, the active layer, and the second conductive semiconductor layer are etched in a vertical direction to form a plurality of semiconductor light emitting devices.

In this step, a mesa process in which the active layer and the second conductive semiconductor layer are partially removed in the vertical direction such that the first conductive semiconductor layer is exposed to the outside is performed, and then an isolation process in which the first conductive semiconductor layer is etched to form a plurality of semiconductor light emitting device arrays is performed. Here, the semiconductor light emitting device may be isolated to a size of 100 μm or less.

Next, a second conductive electrode (or p-type electrode) is formed on one surface of the second conductive semiconductor layer. The second conductive electrode may be formed by a deposition method such as sputtering, but the present disclosure is not limited thereto. However, when the first conductive semiconductor layer and the second conductive semiconductor layer are an n-type semiconductor layer and a p-type semiconductor layer, respectively, the second conductive electrode may be an n-type electrode.

Each of the first and second conductive semiconductor layers and the active layer has a shape in which crystal lattices having a predetermined structure are repeated. Crystal lattices respectively constituting the first and second conductive semiconductor layers and the active layer may have different structures. For this reason, at least one of the first conductive semiconductor layer, the second conductive semiconductor layer, and the active layer may be damaged or broken during the isolation or mesa process. In particular, when even a portion of the active layer is damaged, the semiconductor light emitting device loses its light emitting ability.

Conventionally, in order to solve the problem of semiconductor light emitting device damage with a certain probability, a plurality of semiconductor light emitting devices are disposed for each sub-pixel. Accordingly, even if one of the semiconductor light emitting devices included in a sub-pixel loses light emitting ability, other semiconductor light emitting devices can perform the function of the sub-pixel.

However, this solution is not suitable for a high-resolution display in which a distance between the semiconductor light emitting devices is very small. The present disclosure provides a structure for minimizing a distance between semiconductor light emitting devices while preventing the semiconductor light emitting devices from being damaged with a certain probability.

Hereinafter, a structure of the semiconductor light emitting device (or element) according to the present disclosure will be described in detail.

Figure 10:
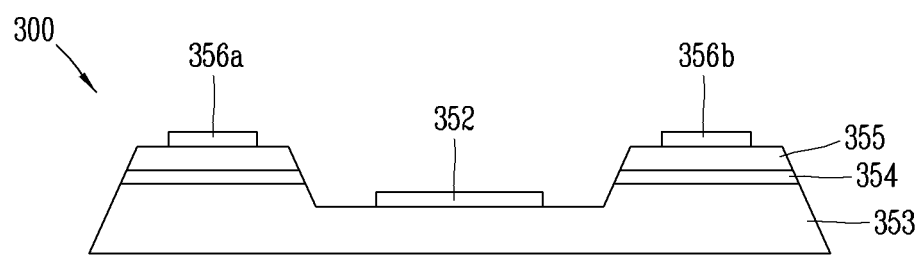
FIG. 10 is a cross-sectional view illustrating a semiconductor light emitting device according to one implementation of the present disclosure.
Figure 11:
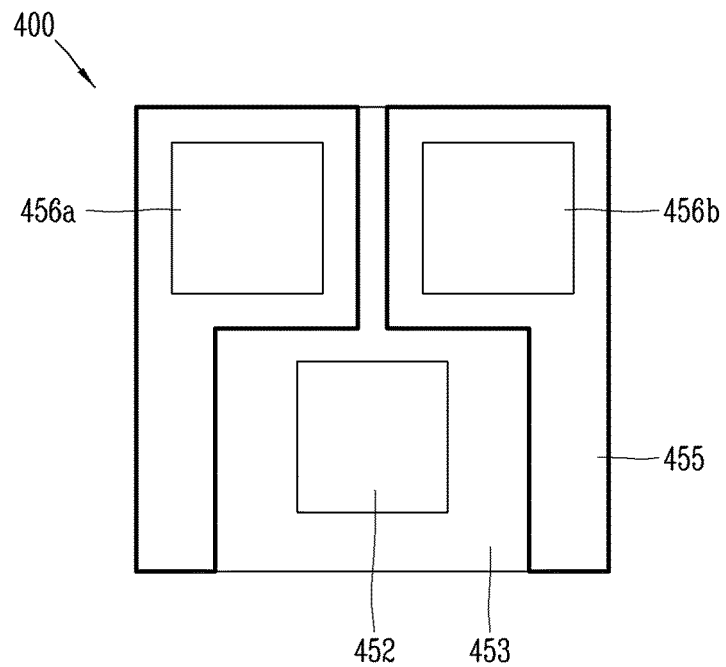
FIGS. 11 and 12 are planar views illustrating a semiconductor light emitting device according to the present disclosure.
Figure 12:
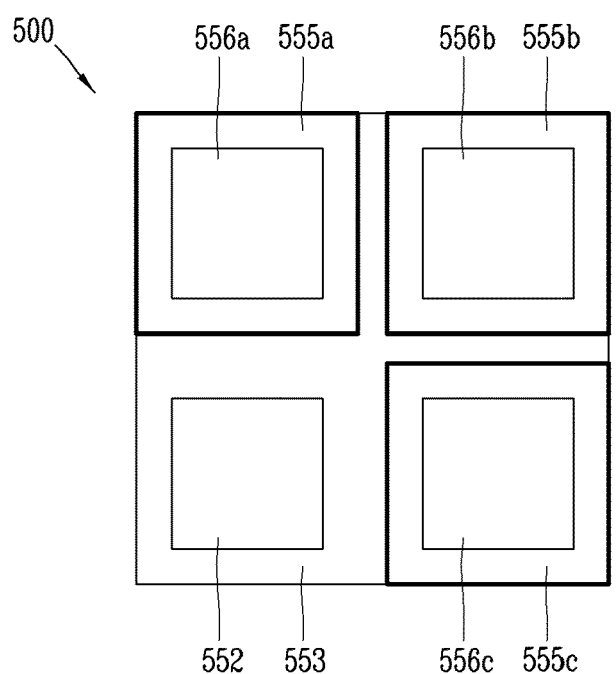

FIG. 10 is a cross-sectional view illustrating a semiconductor light emitting device according to one implementation of the present disclosure, and FIGS. 11 and 12 are planar views illustrating a semiconductor light emitting device according to the present disclosure.

Referring to FIG. 10, a semiconductor light emitting device 300 according to one implementation of the present disclosure includes a first conductive semiconductor layer (or first conductive-type semiconductor layer) 353, a second conductive semiconductor layer (or second conductive-type semiconductor layer) 355 formed on the first conductive semiconductor layer 353, and an active layer 354 disposed between the first and second conductive semiconductor layers 353 and 355.

Here, the second conductive semiconductor layer 355 is provided in plurality on the first conductive semiconductor layer 353, such that a plurality of active layers that are spaced apart from one another are formed on each of the plurality of semiconductor light emitting devices.

That is, the plurality of second conductive semiconductor layers spaced apart from each another are disposed on the first conductive semiconductor layer 353. Each of the active layers is formed at a position where the first conductive semiconductor layer 353 and each of the plurality of second conductive semiconductor layers overlap. Accordingly, one semiconductor light emitting device includes a plurality of second conductive semiconductor layers and a plurality of active layers.

A first conductive electrode 352 is formed on one surface of the first conductive semiconductor layer 353, and second conductive electrodes 356a and 356b are disposed on the plurality of second conductive semiconductor layers 355, respectively. This allows a voltage to be applied to each of the plurality of second conductive semiconductor layers 355. A structure for applying a voltage to each of the plurality of second conductive semiconductor layers will be described later.

The semiconductor light emitting device according to the present disclosure may be implemented in various shapes. In detail, as illustrated in FIG. 10, the first and second conductive semiconductor layers may be alternately disposed along one direction. In this case, the semiconductor light emitting device has a bar shape.

Alternatively, referring to FIG. 11, a semiconductor light emitting device 400 may have a shape with equal length and width, or a shape with little difference in length and width. A first conductive electrode 452 is disposed on one surface of a first conductive semiconductor layer 453. A second conductive semiconductor layer 455 may be defined in a region of the one surface except a region in which the first conductive electrode 452 is disposed. Since an active layer is formed in a region where the first conductive semiconductor layer 453 and the second conductive semiconductor layer 455 overlap, an overlapping area of the first conductive semiconductor layer 453 and the second conductive semiconductor layer 455 should be maximized.

Meanwhile, the second conductive semiconductor layers are not necessarily two in number. Three or more second conductive semiconductor layers may be defined in one semiconductor light emitting device. For example, referring to FIG. 12, three second conductive semiconductor layers 555a, 555b, and 555c may be formed on one surface of a first conductive semiconductor layer 553 included in a semiconductor light emitting device 500. Different second conductive electrodes 556a, 556b, and 556c may be disposed on the three second conductive semiconductor layers 555a, 555b, and 555c, respectively. A first conductive electrode 552 can be provided on the first conductive semiconductor layer 553.

As described above, the semiconductor light emitting device according to the present disclosure includes a plurality of second conductive semiconductor layers and a plurality of active layers. Accordingly, even when any one of the active layers that are spaced apart from each other is damaged, the remaining active layer maintains its light emitting ability. Thus, in the present disclosure, a problem of occurrence of semiconductor light emitting device damage or failure with a certain probability or possibility can be solved without arranging a plurality of semiconductor light emitting devices in a single sub-pixel.

Hereinafter, a structure for applying a voltage to the semiconductor light emitting device according to the present disclosure will be described.

Figure 13:
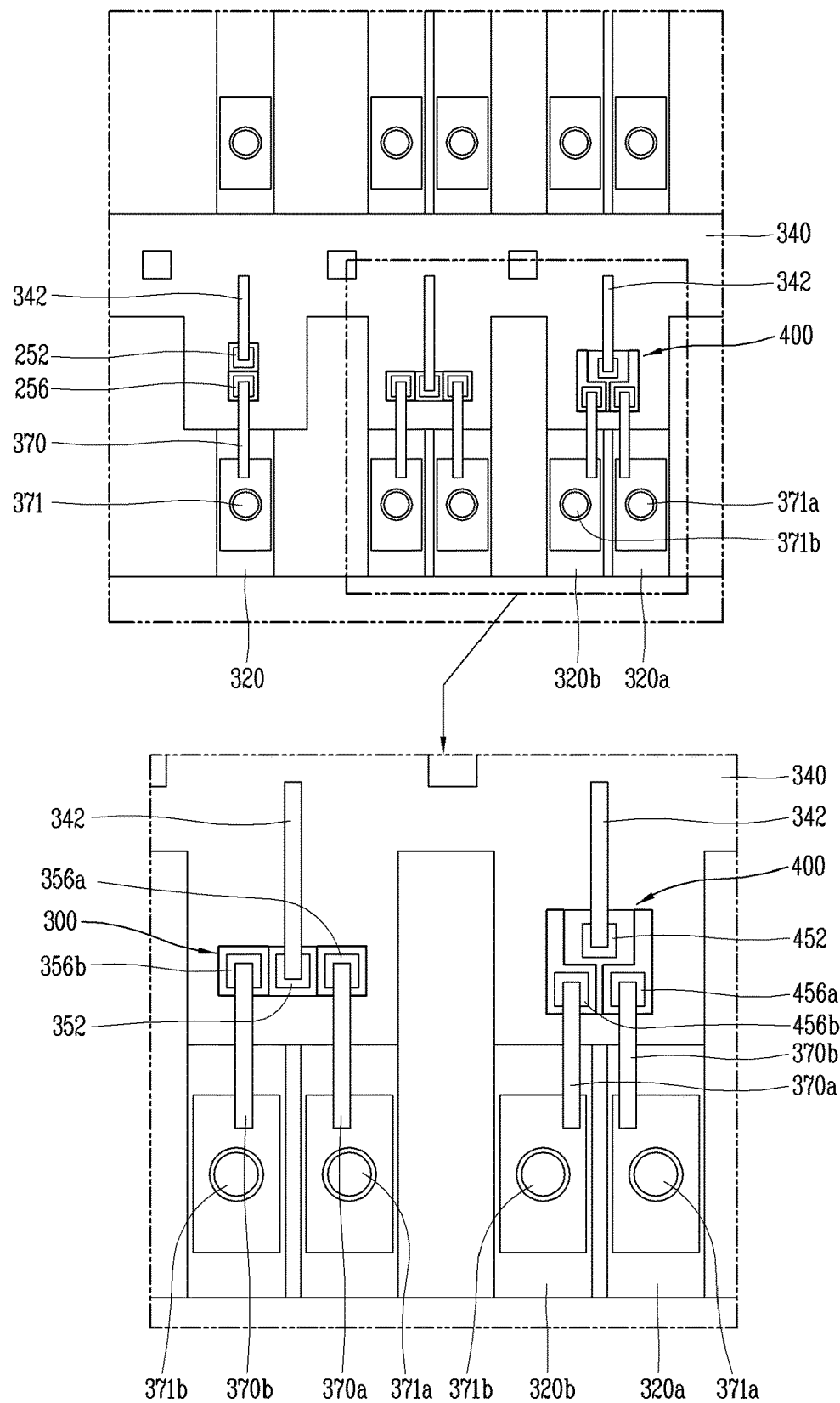
FIG. 13 is a conceptual view illustrating an example state in which semiconductor light emitting devices and wiring electrodes are connected to each other.

FIG. 13 is a conceptual view illustrating an example state in which semiconductor light emitting devices and wiring electrodes are connected to each other.

A plurality of electrode lines are disposed on a substrate. In detail, a first electrode line that is electrically connected to one of first and second conductive electrodes, and a second electrode line that is electrically connected to the remaining one of the first and second conductive electrodes are disposed on the substrate. In this specification, an example in which the first electrode line is connected to the second conductive electrode, and the second electrode line is connected to the first conductive electrode will be described, but the present disclosure is not limited thereto.

A first electrode line 320 and a second electrode line 340 are formed at a substrate illustrated in FIG. 13. The first and second electrode lines 320 and 340 are formed on different planes. In detail, the first electrode line 320 is disposed below the second electrode line 340.

FIG. 13 illustrates a state in which the semiconductor light emitting device described with reference to FIGS. 1 to 9, and the semiconductor light emitting devices described with reference to FIGS. 10 and 12 are connected to wiring electrodes. The semiconductor light emitting device described with reference to FIGS. 1 to 9 includes a first conductive electrode 252 and a second conductive electrode 256. The first conductive electrode 252 is electrically connected to the second electrode line 340 through an auxiliary electrode 342, and the second conductive electrode 256 is electrically connected to the first electrode line 320 through an auxiliary electrode 370 and a via hole 371.

Meanwhile, semiconductor light emitting devices according to one implementation of the present disclosure each include a plurality of second conductive semiconductor layers, and second conductive electrodes are formed on the second conductive semiconductor layers, respectively. Each of the second conductive electrodes is electrically connected to one of a plurality of electrode lines.

Referring to the semiconductor light emitting device 300 described with reference to FIG. 10, the plurality of second conductive semiconductor layers are electrically connected to different electrode lines. In detail, one (356a) of a plurality of second conductive electrodes 356a and 356b included in the semiconductor light emitting device 300 is electrically connected to one (320a) of a plurality of first electrode lines 320a and 320b through an auxiliary electrode 370a and a first via hole 371a. The remaining one (356b) of the plurality of second conductive electrodes 356a and 356b is electrically connected to the remaining one (320b) of the plurality of first electrode lines 320a and 320b through an auxiliary electrode 370b and a second via hole 371b. Meanwhile, one (or single) first conductive electrode 352 is electrically connected to the second electrode line 340 through an auxiliary electrode 342.

Referring to the semiconductor light emitting device 400 described with reference to FIG. 11, the plurality of second conductive semiconductor layers are electrically connected to different electrode lines. In detail, one (456a) of a plurality of second conductive electrodes 456a and 456b included in the semiconductor light emitting device 400 is electrically connected to one (320a) of a plurality of electrode lines 320a and 320b through an auxiliary electrode 370a and a first via hole 371a. The remaining one (456b) of the plurality of second conductive electrodes 456a and 456b is electrically connected to the remaining one (320b) of the plurality of first electrode lines 320a and 320b through an auxiliary electrode 370b and a second via hole 371b. Meanwhile, one first conductive electrode 452 is electrically connected to the second electrode line 340 through an auxiliary electrode 342.

As such, in the present disclosure, the plurality of second conductive semiconductor layers are electrically connected to different electrode lines, so that even when one of the plurality of active layers provided at the semiconductor light emitting device is damaged, light can be emitted through the remaining active layer.

Meanwhile, although not illustrated, a plurality of second conductive semiconductor layers provided in a single semiconductor light emitting device may be connected in parallel to the same electrode line. In this case, when a voltage is applied to first and second electrode lines, the magnitude of current flowing through the entire semiconductor light emitting device is kept constant all the time. Taking the semiconductor light emitting device described with reference to FIG. 10 as an example, when a voltage is applied to the first and second electrode lines in a state that both of the active layers are not damaged, current flowing through the entire semiconductor light emitting device is branched or diverged into two second conductive semiconductor layers. Assuming that the amount of light required by one semiconductor light emitting device is 100, the amount of light emitted from each of the two active layers is 50.

If one of the two active layers is damaged, current flowing through the entire semiconductor light emitting device flows only through a conductive semiconductor layer that overlaps an undamaged active layer of the two second conductive semiconductor layers. Assuming that the amount of light required by one semiconductor light emitting device is 100, the amount of light emitted from the undamaged active layer is 100.

Thus, in the present disclosure, the original light quantity of the semiconductor light emitting device can be maintained without a separate control and repair when a part of the plurality of active layers is damaged.

Figure 14:
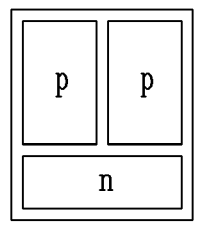
FIG. 14 is a conceptual view illustrating various modified examples of a semiconductor light emitting device according to the present disclosure.
Figure 14:
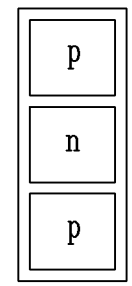
Figure 14:
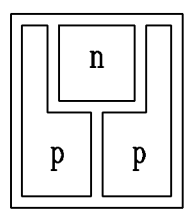
Figure 14:
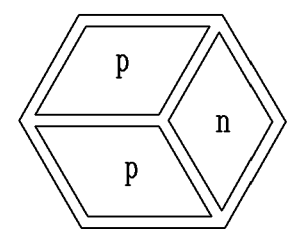
Figure 14:
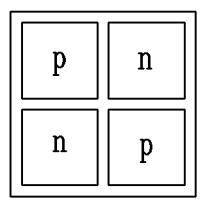
Figure 14:
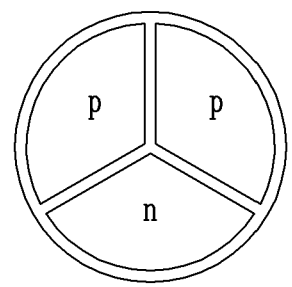

Referring to FIG. 14, the flip chip type semiconductor light emitting device described above may be implemented in various shapes. In detail, a semiconductor light emitting device may be formed in a rectangular shape ((a), (c), and (e)), such that p-type and n-type electrodes may be formed within a range that can maximize the use of a rectangular plane. However, the present disclosure is not limited thereto, and the semiconductor light emitting device may be implemented in other various shapes, such as a bar shape (b), a hexagonal shape (d), and a circular shape (f). In FIG. 14, a first conductive semiconductor layer is illustrated as an n-type semiconductor layer, and a second conductive semiconductor layer is illustrated as a p-type semiconductor layer. However, the present disclosure is not limited thereto.

Meanwhile, the present disclosure may also be applied to a vertical type semiconductor light emitting device. Hereinafter, a vertical type semiconductor light emitting device including a plurality of active layers will be described.

Figure 15:
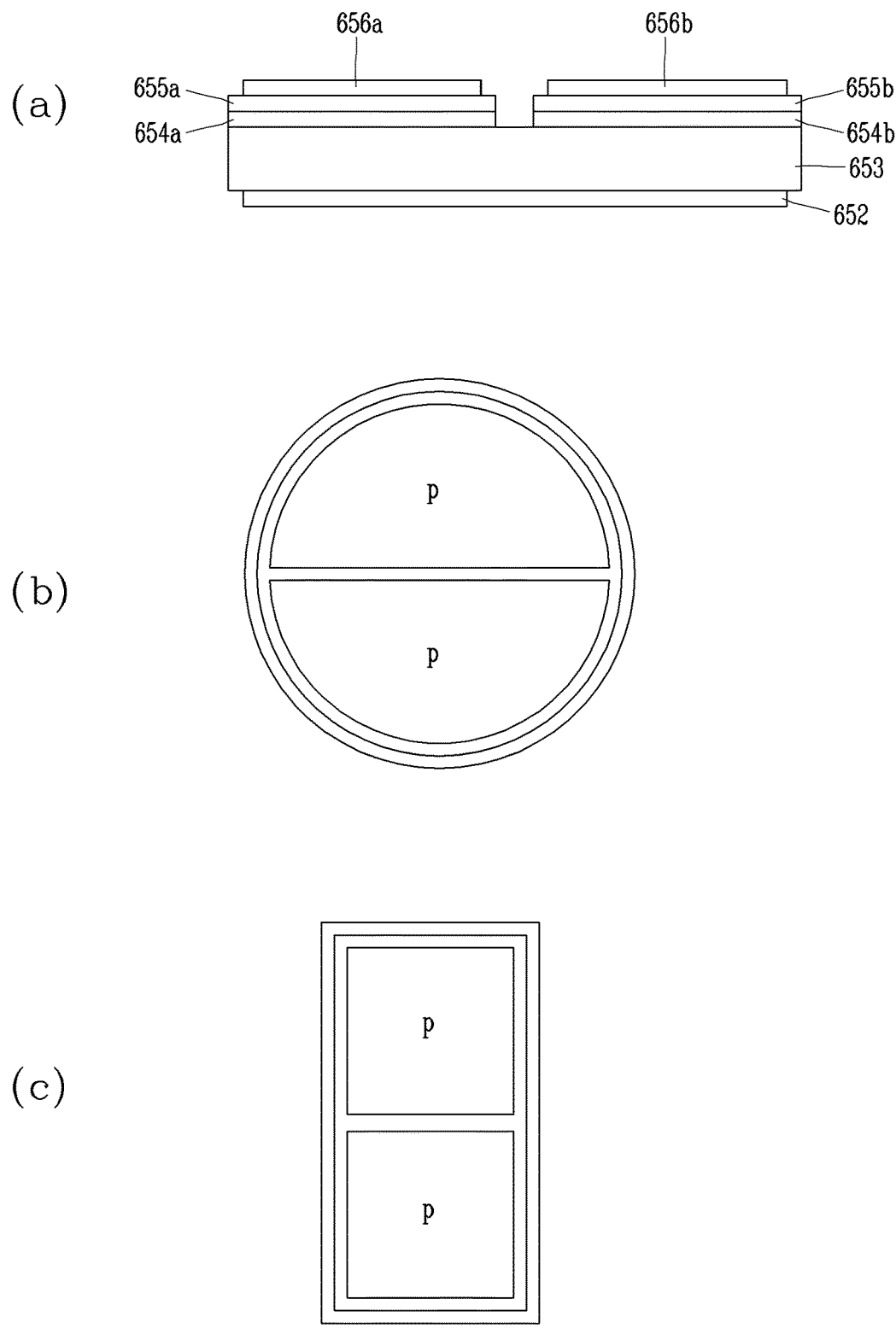
FIG. 15 is a conceptual view illustrating a vertical type semiconductor light emitting device including a plurality of active layers.

FIG. 15 is a conceptual view illustrating a vertical type semiconductor light emitting device including a plurality of active layers.

Referring to (a) of FIG. 15, a plurality of second conductive semiconductor layers 655a and 655b may be disposed at one of both (or opposite) surfaces of a first conductive semiconductor layer 653, and a first conductive electrode 652 may be disposed at the remaining one surface of the both surfaces of the first conductive semiconductor layer 653 that is different from the one surface at which the plurality of second conductive semiconductor layers 655a and 655b are disposed. Accordingly, the first conductive electrode 652 and a plurality of second conductive electrodes 656a and 656b are disposed to face opposite directions.

Accordingly, a plurality of active layers 654a and 654b are defined in one vertical type semiconductor light emitting device, and even when one of the plurality of active layers is damaged, light is emitted through the remaining active layer.

The vertical type semiconductor light emitting device may be formed in a circular shape as shown in (b) of FIG. 15, or in a rectangular shape as shown in (c) of FIG. 15. A plurality of p-type electrodes may be disposed at one surface of the semiconductor light emitting device. In FIG. 15, a first conductive semiconductor layer is illustrated as an n-type semiconductor layer, and a second conductive semiconductor layer is illustrated as a p-type semiconductor layer. However, the present disclosure is not limited thereto.

As such, the semiconductor light emitting device according to the present disclosure includes a plurality of light emitting regions, light emitting ability of the semiconductor light emitting device can be maintained even when one of the light emitting regions loses its light emitting ability. Accordingly, there is no need to dispose a plurality of semiconductor light emitting devices for each sub-pixel in preparation for semiconductor light emitting device damage. Thus, a high-resolution display with a very small distance between semiconductor light emitting devices can be achieved.

The aforementioned display device using the semiconductor light emitting devices are not limited to the configuration and the method of the implementations described above, but the implementations may be configured such that all or some of the implementations are selectively combined so that various modifications can be made.

The invention claimed is:
1. A display device comprising:
a substrate including a plurality of electrode lines; and
a plurality of semiconductor light emitting devices disposed on the substrate and electrically connected to the plurality of electrode lines;
wherein each of the plurality of semiconductor light emitting devices comprises:
a first conductive semiconductor layer;
a plurality of second conductive semiconductor layers formed on the first conductive semiconductor layer; and
an active layer formed between the first and second conductive semiconductor layers, and
wherein each of the plurality of semiconductor light emitting devices includes a plurality of active layers spaced apart from each other,
wherein the plurality of second conductive semiconductor layers having a set of the plurality of active layers are supplied with a distributed current from a same electrode line, in order to increase an amount of light emitted from remaining active layers that are not broken as a number of broken active layers of the plurality of semiconductor light emitting devices increases when some of the plurality of active layers are broken,
wherein the same electrode line is a line of an electrode controlling one color, and active layers among the set of the plurality of active layers and provided on each of the plurality of second conductive semiconductor layers that receive a distributed current from the same electrode line emit light with a same color.

2. The display device of claim 1, wherein each of the plurality of semiconductor light emitting devices further comprises:
a first conductive electrode disposed on the first conductive semiconductor layer; and
a plurality of second conductive electrodes disposed on the plurality of second conductive semiconductor layers, respectively, and
wherein each of the plurality of second conductive semiconductor layers is electrically connected to one of the plurality of electrode lines.

3. The display device of claim 2, wherein a plurality of second conductive semiconductor layers are connected in parallel to the same electrode line of the plurality of electrode lines.

4. The display device of claim 2, wherein a plurality of second conductive semiconductor layers are electrically connected to different electrode lines of the plurality of electrode lines.

5. The display device of claim 2, wherein a plurality of second conductive semiconductor layers are disposed at one surface of opposite surfaces of the first conductive semiconductor layer, and
wherein the first conductive electrode is disposed on the one surface, of the opposite surfaces of the first conductive semiconductor layer, where the plurality of second conductive semiconductor layers are disposed.

6. The display device of claim 2, wherein a plurality of second conductive semiconductor layers are disposed at one surface of opposite surfaces of the first conductive semiconductor layer, and
wherein the first conductive electrode is disposed on another surface of the opposite surfaces of the first conductive semiconductor layer that is different from the one surface where the plurality of second conductive semiconductor layers are disposed.

7. A semiconductor light emitting device comprising:
a first conductive semiconductor layer;
a plurality of second conductive semiconductor layers formed on the first conductive semiconductor layer; and
a plurality of active layers formed between the first and second conductive semiconductor layers,
wherein the plurality of active layers are spaced apart from each other and are formed on the first conductive semiconductor layer,
wherein the plurality of second conductive semiconductor layers having a set of the plurality of active layers are supplied with a distributed current from a same electrode line, in order to increase an amount of light emitted from remaining active layers that are not broken as a number of broken active layers increases when some of the plurality of active layers are broken, and
wherein the same electrode line is a line of an electrode controlling one color, and active layers among the set of the plurality of active layers and provided on each of the plurality of second conductive semiconductor layers that receive a distributed current from the same electrode line emit light with a same color.

8. The semiconductor light emitting device of claim 7, wherein the plurality of second conductive semiconductor layers are spaced apart from each other, and
wherein an exposed portion of the first conductive semiconductor layer is located between an adjacent pair of the plurality of second conductive semiconductor layers.

9. The semiconductor light emitting device of claim 8, further comprising:
a first conductive electrode located on the exposed portion of the first conductive semiconductor layer between the adjacent pair of the plurality of second conductive semiconductor layers; and
a plurality of second electrodes on the plurality of second conductive semiconductor layers, respectively.

10. The semiconductor light emitting device of claim 9, wherein the exposed portion of the first conductive semiconductor layer is located lower than the plurality of active layers, and
wherein the first conductive electrode is located lower than the plurality of active layers.

11. The semiconductor light emitting device of claim 9, wherein the first conductive semiconductor layer has a rectangular shape, a hexagonal shape, or a circular shape.

12. The semiconductor light emitting device of claim 11, wherein the first conductive electrode and the plurality of second electrodes are one of a rectangular shape, a polygonal shape, or partially curved.

13. The semiconductor light emitting device of claim 7, further comprising:
a first conductive electrode located on a first surface of the first conductive semiconductor layer; and
a plurality of second electrode on the plurality of second conductive semiconductor layers, respectively,
wherein the plurality of second conductive semiconductor layers are on a second surface of the first conductive semiconductor layer, the second surface being an opposite surface to the first surface.

14. The display device of claim 1, wherein the plurality of semiconductor light emitting devices are one of a rectangular shape, a hexagonal shape, or a circular shape.

15. A semiconductor light emitting device comprising:
a first conductive semiconductor layer;
a plurality of second conductive semiconductor layers disposed on the first conductive semiconductor layer;
at least one first conductive electrode disposed on the first conductive semiconductor layer; and
a plurality of second conductive electrodes disposed on the plurality of second conductive semiconductor layers, respectively,
wherein a number of the plurality of second conductive electrodes is equal to or greater than a number of the at least one first conductive electrode, and
wherein the plurality of second conductive semiconductor layers are supplied with a distributed current from a same electrode line, and
wherein the same electrode line is a line of an electrode controlling one color, and active layers provided on each of the plurality of second conductive semiconductor layers that receive a distributed current from the same electrode line emit light with a same color.

16. The semiconductor light emitting device of claim 15, further comprising:
a plurality of active layers, including the active layers, disposed between the first conductive layer and the plurality of second conductive semiconductor layers,
wherein the plurality of active layers are spaced apart from each other and are disposed on the first conductive semiconductor layer.

17. The semiconductor light emitting device of claim 15, wherein the plurality of second conductive semiconductor layers are spaced apart from each other, and wherein an exposed portion of the first conductive semiconductor layer is disposed between an adjacent pair of the plurality of second conductive semiconductor layers.

18. The semiconductor light emitting device of claim 15, wherein the plurality of second conductive semiconductor layers and the at least one first conductive electrode are disposed on a first surface of the first conductive semiconductor layer.

19. The semiconductor light emitting device of claim 15, wherein the at least one first conductive electrode and the plurality of second conductive electrodes are separated by an exposed portion of the first conductive semiconductor layer.

20. The semiconductor light emitting device of claim 15, wherein the plurality of second conductive semiconductor layers and the at least one first conductive electrode are disposed on opposite surfaces of the first conductive semiconductor layer.

* * * * *